United States Patent
Wang et al.

(10) Patent No.: US 10,126,479 B2
(45) Date of Patent: Nov. 13, 2018

(54) MULTILAYER OPTICAL COMPENSATION FILM HAVING REVERSED WAVELENGTH DISPERSION

(71) Applicant: Akron Polymer Systems, Inc., Akron, OH (US)

(72) Inventors: Bin Wang, Kingsport, TN (US); Peiyao Wang, Akron, OH (US); Dong Zhang, Uniontown, OH (US); Thauming Kuo, Kingsport, TN (US); Alan Phillips, Johnson City, TN (US); Lang Hu, Akron, OH (US); Xiaoliang Zheng, Hudson, OH (US); Wentao Li, Kingsport, TN (US); Liu Deng, Kingsport, TN (US); Frank Harris, Boca Raton, FL (US); Ted Germroth, Kingsport, TN (US)

(73) Assignee: Akron Polymer Systems, Inc., Akron, OH (US)

( * ) Notice: Subject to any disclaimer, the term of this patent is extended or adjusted under 35 U.S.C. 154(b) by 0 days.

(21) Appl. No.: 15/674,909

(22) Filed: Aug. 11, 2017

(65) Prior Publication Data

US 2018/0052271 A1 Feb. 22, 2018

Related U.S. Application Data

(60) Provisional application No. 62/374,247, filed on Aug. 12, 2016, provisional application No. 62/486,207, filed on Apr. 17, 2017.

(51) Int. Cl.
*G02B 5/30* (2006.01)
*C08L 25/18* (2006.01)
(Continued)

(52) U.S. Cl.
CPC ............ *G02B 5/3083* (2013.01); *B32B 27/08* (2013.01); *B32B 27/302* (2013.01); *C08F 8/30* (2013.01);
(Continued)

(58) Field of Classification Search
CPC .............. G02B 5/3083; G02F 1/13363; G02F 2001/133638; C08L 25/18; C08F 112/14;
(Continued)

(56) References Cited

U.S. PATENT DOCUMENTS 3,573,253 A  3/1971  Gray
6,049,419 A * 4/2000 Wheatley .......... B32B 17/10018
                                                        359/359
(Continued)

FOREIGN PATENT DOCUMENTS

CN     105037602 A    11/2015
EP      2060937 A1     5/2009
(Continued)

OTHER PUBLICATIONS

ISR and Written Opinion from PCT/US2017/046498 dated Nov. 21, 2017.
(Continued)

*Primary Examiner* — Ricky D Shafer
(74) *Attorney, Agent, or Firm* — Calfee, Halter & Griswold LLP

(57) ABSTRACT

Disclosed is a multilayer optical compensation film comprising a first layer comprising a positive C-plate material and a second layer comprising a polyimide, as well as polymer compositions and resins and solutions containing said polymer compositions. The optical compensation film has a reversed wavelength dispersion that is capable of providing an achromatic (or broadband) retardation compensation. The optical film can be used in optical devices
(Continued)

such as liquid crystal displays (LCD) or organic light emitting diode (OLED) displays.

44 Claims, 1 Drawing Sheet

(51) Int. Cl.
| | |
|---|---|
| *B32B 27/08* | (2006.01) |
| *B32B 27/30* | (2006.01) |
| *C08F 112/14* | (2006.01) |
| *C08G 73/10* | (2006.01) |
| *G02F 1/13363* | (2006.01) |
| *H01L 51/52* | (2006.01) |
| *C08F 12/20* | (2006.01) |
| *C08F 8/30* | (2006.01) |
| *C09D 125/18* | (2006.01) |

(52) U.S. Cl.
CPC ............ *C08F 12/20* (2013.01); *C08F 112/14* (2013.01); *C08G 73/1007* (2013.01); *C08G 73/1067* (2013.01); *C08L 25/18* (2013.01); *C09D 125/18* (2013.01); *G02F 1/13363* (2013.01); *H01L 51/5281* (2013.01); *B32B 2307/42* (2013.01); *G02F 2001/133638* (2013.01)

(58) Field of Classification Search
CPC ............ C08G 73/1007; C08G 73/1067; B32B 27/08; B27B 27/302; G08F 8/30; G08F 12/20
USPC ................ 359/489.02, 349.07; 349/117, 118
See application file for complete search history.

(56) References Cited

U.S. PATENT DOCUMENTS

| | | | |
|---|---|---|---|
| 6,069,278 A | 5/2000 | Chuang | |
| 7,737,308 B1 | 6/2010 | Straessler | |
| 7,848,020 B2 | 12/2010 | Hendrix et al. | |
| 8,304,079 B2 | 11/2012 | Germroth et al. | |
| 8,545,970 B2 | 10/2013 | Doi et al. | |
| 8,802,238 B2 | 8/2014 | Zheng et al. | |
| 8,889,043 B2 | 11/2014 | Wang et al. | |
| 9,096,719 B2 | 8/2015 | Zhang et al. | |
| 9,234,987 B2 | 1/2016 | Wang et al. | |
| 2003/0212243 A1 | 11/2003 | Hergenrother et al. | |
| 2006/0141219 A1* | 6/2006 | Benson, Jr. | B29C 55/04 428/156 |
| 2008/0239491 A1 | 10/2008 | Zheng et al. | |
| 2008/0241565 A1 | 10/2008 | Germroth et al. | |
| 2011/0076487 A1 | 3/2011 | Zheng et al. | |
| 2012/0113338 A1 | 5/2012 | Saigusa et al. | |
| 2013/0279126 A1 | 10/2013 | Chen et al. | |
| 2014/0205822 A1 | 7/2014 | Wang et al. | |
| 2016/0215132 A1* | 7/2016 | Zheng | G02B 1/04 |
| 2018/0044444 A1* | 2/2018 | Zhang | C08F 8/20 |
| 2018/0044447 A1* | 2/2018 | Hu | C08F 12/26 |
| 2018/0072882 A1* | 3/2018 | Zheng | C08L 25/18 |

FOREIGN PATENT DOCUMENTS

| | | |
|---|---|---|
| JP | 2010077318 A | 4/2010 |
| JP | 2011102868 A | 5/2011 |
| KR | 10-2015-0037443 A | 4/2015 |
| WO | 2016118873 A1 | 7/2016 |
| WO | 2018031853 A1 | 2/2018 |
| WO | 2018031886 A1 | 2/2018 |
| WO | 2018031909 A1 | 2/2018 |

OTHER PUBLICATIONS

ISR and Written Opinion from PCT/US2017/046548 dated Nov. 22, 2017.
ISR and Written Opinion from PCT/US2017/046432 dated Nov. 21, 2017.
ISR and Written Opinion from PCT/US2017/046490 dated Nov. 20, 2017.

* cited by examiner

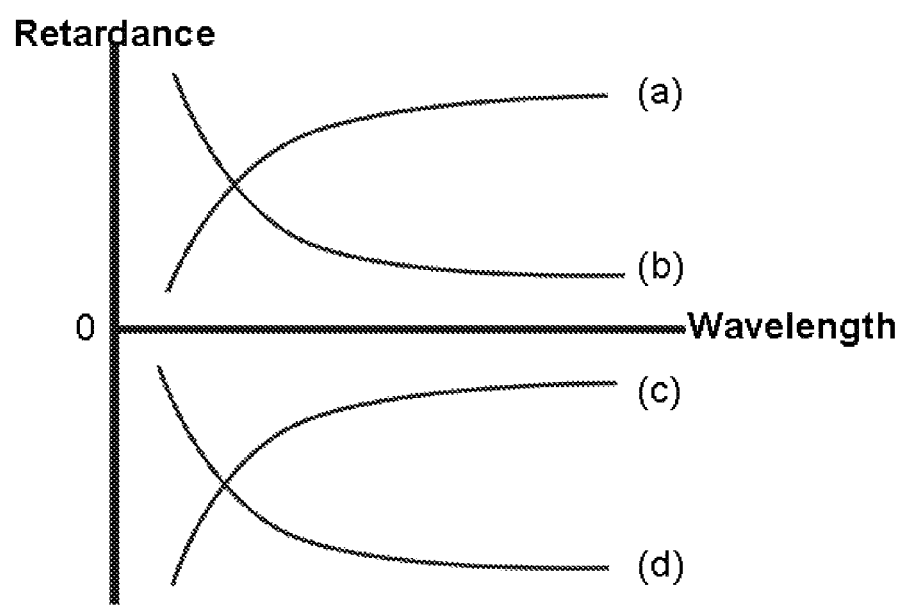

MULTILAYER OPTICAL COMPENSATION FILM HAVING REVERSED WAVELENGTH DISPERSION

CROSS-REFERENCE TO RELATED APPLICATIONS

This application claims priority to and the benefit of U.S. Provisional Patent Applications No. 62/486,207, filed Apr. 17, 2017, and No. 62/374,247, filed Aug. 12, 2016, the entire content of which is incorporated by reference herein.

FIELD OF THE INVENTION

This invention pertains to a wide-view optical compensation film having positive out-of-plane retardations. More specifically, this invention relates to a multilayer optical film having a reversed wavelength dispersion that is capable of providing an achromatic (or broadband) retardation compensation. The optical film of the invention may be used in an optical device such as liquid crystal display (LCD), organic light emitting diode (OLED) display, 3D display, optical switch, or waveguide where a controlled light management is desirable.

BACKGROUND OF THE INVENTION

It is known in the art of optical compensation that the phase retardation of light varies according to wavelength, causing color shift. This wavelength dependence (or dispersion) characteristic of the compensation film may be taken into account when designing an optical device so that color shift is reduced. Wavelength dispersion curves are defined as "normal" (or "proper") or "reversed" with respect to the compensation film having positive or negative retardance (or retardation). A compensation film with positive retardance (positive A- or C-plate) may have a normal curve in which the value of phase retardation is increasingly positive toward shorter wavelengths or a reversed curve in which the value of phase retardation is decreasingly positive toward shorter wavelengths. A compensation film with negative retardance (negative A- or C-plate) may have a normal curve in which the value of phase retardation is increasingly negative toward shorter wavelengths or a reversed curve in which the value of phase retardation is decreasingly negative toward shorter wavelengths. Exemplary shapes of these curves are depicted in FIG. 1.

Wave plates are customarily named as follows in accordance with their refractive index profiles:
positive C-plate: $n_x=n_y<n_z$; negative C-plate: $n_x=n_y>n_z$
positive A-plate: $n_x>n_y=n_z$; negative A-plate: $n_x<n_y=n_z$
wherein, $n_x$ and $n_y$ represent in-plane refractive indices, and $n_z$ the thickness refractive index.
C-plate and A-plate wave plates are uniaxial birefringent plates. A wave plate can also be biaxial birefringent, where $n_x$, $n_y$, and $n_z$ are all not equal; such plates are customarily called biaxial films.

An A-plate having in-plane retardation ($R_e$) equal to a quarter of the wavelength ($\lambda/4$) is called quarter wave plate (QWP). Likewise, an A-plate having $R_e$ equal to half of the wavelength ($\lambda/2$) is called half wave plate (HWP). An ideal achromatic QWP would be able to retard an incident polarized light by $\lambda/4$ at every wavelength. In order to achieve this ideal achromatic QWP, the wavelength dispersion of the QWP has to be reversed and must satisfy the following equations:

$$R_e(450)/R_e(550)=0.818 \text{ and } R_e(650)/R_e(550)=1.182,$$

wherein $R_e(450)$, $R_e(550)$, and $R_e(650)$ are in-plane retardations at the light wavelengths of 450 nm, 550 nm, and 650 nm respectively. An achromatic (or broadband) wave plate is highly desirable since it can direct the light in the same manner at each wavelength to yield the optimal viewing quality. A common wave plate, however, exhibits a normal dispersion curve, which is not suitable for broadband wave plate application.

Similar to positive A-plates, positive C-plates having reversed wavelength dispersion curves are also desirable for broadband applications. Such C-plates can satisfy the following equations:

$$R_{th}(450)/R_{th}(550)=0.818 \text{ and } R_{th}(650)/R_{th}(550)=1.182,$$

wherein $R_{th}(450)$, $R_{th}(550)$, and $R_{th}(650)$ are out-of-plane retardations at the light wavelengths of 450 nm, 550 nm, and 650 nm respectively. There exists a need for a positive C-plate having reversed wavelength dispersion characteristics with respect to out-of-plane retardation.

A-plates are commonly used in liquid crystal displays (LCDs) as compensation films to improve the viewing angles. They can also be used in an OLED (organic light emitting diode) display device. For example, a QWP can be used with a linear polarizer to provide a circular polarizer in an OLED device to reduce the ambient light reflected by OLED for improved viewing quality. These applications typically utilize the in-plane retardation provided by the A-plate for in-plane phase-shift compensation. For example, A-plate combining with C-plate is particularly useful in reducing light leakage of the crossed polarizers at oblique viewing angles. The A-plate, however, also exhibits a negative out-of-plane retardation $R_{th}$, which is defined by the equation $R_{th}=[n_z-(n_x+n_y)/2]\times d$ with a value of $|R_e/2|$ arising from its orientation. This characteristic can be beneficial when a negative $R_{th}$ is desirable in an optical device. For example, in a vertically aligned (VA) mode LCD, the liquid crystal molecules in the LC cell are aligned in a homeotropic manner, which results in positive retardation. An A-plate, thus, can provide an out-of-plane compensation in addition to in-plane compensation in VA-LCD. In other devices, such as in-plane switch (IPS) mode LCD and OLED display, however, the $R_{th}$ exhibited in the A-plate is not desirable since it can cause phase shift in off-axis light and lead to light leakage. Thus, there exists an additional need in the art to provide a positive in-plane retarder having reduced out-of-plane retardation for improved viewing angle and contrast ratio of the display. The reduction of the out-of-plane retardation can be achieved by using a positive-C plate in combination with the positive A-plate. Further, it is most desirable that the positive-C plate has a reversed wavelength dispersion characteristic in order to achieve the achromatic compensation.

SUMMARY OF THE INVENTION

In embodiments disclosed herein, a multilayer optical compensation film comprises,
(a) a first layer comprising a positive C-plate material and
(b) a second layer comprising a polyimide,
wherein said multilayer optical compensation film has positive out-of-plane retardations that satisfy the relations of $0.7<R(450)/R(550)<1$ and $1<R(650)/R(550)<1.25$, wherein $R(450)$, $R(550)$, and $R(650)$ are out-of-plane retardations at the light wavelengths of 450 nm, 550 nm, and 650 nm respectively, and wherein said positive C-plate material is a material capable of providing a positive out-of-plane birefringence of greater than 0.015 throughout the light wavelength range of from 400 nm to 800 nm.

In certain embodiments disclosed herein, there is provided a multilayer optical compensation film comprising,
(a) a styrenic fluoropolymer film and
(b) a polyimide film,
wherein said multilayer optical compensation film has positive out-of-plane retardations that satisfy the relations of $0.7<R(450)/R(550)<1$ and $1<R(650)/R(550)<1.25$, wherein R(450), R(550), and R(650) are out-of-plane retardations at the light wavelengths of 450 nm, 550 nm, and 650 nm respectively, and wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom.

The styrenic fluoropolymer film (a) is made by solution cast of a polymer solution comprising a styrenic fluoropolymer having a styrenic moiety of:

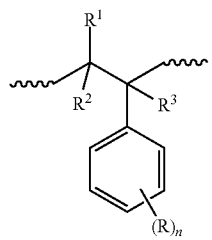

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein each R is independently a substituent on the styrenic ring with n is an integer from 0 to 5 representing the number of the substituents R on the styrenic ring.

In one embodiment, the styrenic fluoropolymer is a nitrated styrenic fluoropolymer having a styrenic moiety of:

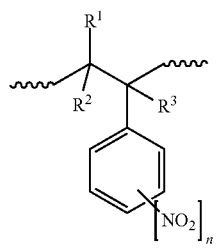

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group on the styrenic ring.

The polyimide film (b) is made by solution casting a polymer solution comprising a polyimide. The polyimide used in this invention contains rigid rod-like groups that are capable of forming out-of-plane orientation when solution cast onto a substrate, In further embodiments described herein, a multilayer optical compensation film comprises,
(a) a styrenic fluoropolymer film and
(b) a polyimide film,
wherein said multilayer optical compensation film has positive out-of-plane retardations that satisfy the relations of $0.98<R(450)/R(550)<1.02$ and $0.98<R(650)/R(550)<1.02$, wherein R(450), R(550), and R(650) are out-of-plane retardations at the light wavelengths of 450 nm, 550 nm, and 650 nm respectively.

In certain other embodiments, a polymer resin is provided. The resin has a moiety of:

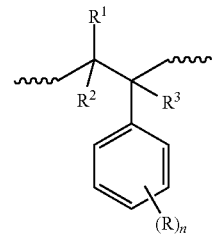

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, wherein each R is independently a substituent on the styrenic ring, and wherein n is an integer from 0 to 5 representing the number of the substituents on the styrenic ring. In certain embodiments, R is a nitro group. In certain embodiments, the polymer resin comprises a mixture or copolymer of a styrenic fluoropolymer (above) and a polyimide.

In other embodiments of the present invention, a polymer solution is provided. The polymer solution comprises a solvent and a polymer having a styrenic moiety of:

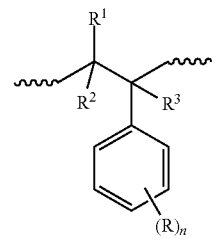

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, wherein each R is independently a substituent on the styrenic ring, and wherein n is an integer from 0 to 5 representing the number of the substituents R on the styrenic ring. In certain embodiments, R is a nitro group. In certain embodiments, the polymer comprises a mixture or copolymer of a styrenic fluoropolymer (above) and a polyimide.

BRIEF DESCRIPTION OF THE DRAWINGS

FIG. 1 is a graph depicting the shapes of exemplary wavelength dispersion curves for: (a) a reversed curve for positive retardation, (b) a normal curve for positive retardation, (c) a normal curve for negative retardation and (d) a reversed curve for negative retardation.

DETAILED DESCRIPTION OF THE INVENTION

Retardation (R) of a wave plate is defined by the equation $R=\Delta n \times d$, wherein $\Delta n$ is the birefringence and d is the thickness of the wave plate. Birefringence is classified into in-plane birefringence $\Delta n_{in} = n_x - n_y$ and out-of-plane birefringence $\Delta n_{th} = n_z - (n_x + n_y)/2$. In-plane retardation is represented by the equation $R_e = (n_x - n_y) \times d$ and out-of-plane retardation by the equation $R_{th} = [n_z - (n_x + n_y)/2] \times d$.

Birefringence ($\Delta n$) of a wave plate may be measured by determining the birefringence of a wave plate over a wavelength range of about 400 nm to about 800 nm at different increments. Alternatively, birefringence may be measured at a specific light wavelength. Throughout this description, when a birefringence or retardation relation is given without specifying a wavelength, it is meant to be true throughout the wavelength range of from about 400 nm to about 800 nm.

In some embodiments, this invention provides a multilayer optical compensation film comprising,
  (a) a first layer comprising a positive C-plate material and
  (b) a second layer comprising a polyimide,
wherein said multilayer optical compensation film has positive out-of-plane retardations that satisfy the relations of $0.7 < R(450)/R(550) < 1$ and $1 < R(650)/R(550) < 1.25$, wherein R(450), R(550), and R(650) are out-of-plane retardations at the light wavelengths of 450 nm, 550 nm, and 650 nm respectively, and wherein said positive C-plate material is a material capable of providing a positive out-of-plane birefringence of greater than 0.015 throughout the light wavelength range of from 400 nm to 800 nm.

Examples of the positive C-plate material are known in the art such as, for example, liquid crystal molecules, polyacrylate, polyester, cellulose ester, mesogen-jacketed polymer (as disclosed in U.S. Pat. No. 9,096,719, incorporated herein by reference), styrenic polymer, styrenic fluoropolymer, and vinyl aromatic fluoropolymer. Desirably, the positive C-plate material can provide a positive out-of-plane birefringence of greater than 0.015, greater than 0.02, greater than 0.025, greater than 0.03, or greater than 0.035 throughout the light wavelength range of from 400 nm to 800 nm. The most preferred first layer (a) is a styrenic fluoropolymer film and the second layer is a polyimide film.

In certain embodiments disclosed herein, the multilayer optical compensation film comprises,
  (a) a styrenic fluoropolymer film and
  (b) a polyimide film,
wherein said multilayer optical compensation film has positive out-of-plane retardations that satisfy the relations of $0.7 < R(450)/R(550) < 1$ and $1 < R(650)/R(550) < 1.25$, wherein R(450), R(550), and R(650) are out-of-plane retardations at the light wavelengths of 450 nm, 550 nm, and 650 nm respectively.

The multilayer optical compensation film in accordance with the present invention has a positive out-of-plane retardation ($R_{th}$) and a reversed out-of-plane wavelength dispersion characteristic, in which the value of the phase retardation is decreasingly positive toward shorter wavelengths. This dispersion characteristic is expressed by the ratios of the retardations as measured at the wavelengths of 450 nm, 550 nm, and 650 nm, which satisfy the relations of $R(450)/R(550) < 1$ and $R(550)/R(650) > 1$. The ratio of R(450)/R(550) can be 0.71 to 0.99, 0.72 to 0.98, 0.74 to 0.97, 0.76 to 0.96, 0.78 to 0.95, 0.8 to 0.9, or 0.81 to 0.85. The ratio of R(650)/R(550) can be 1.01 to 1.24, 1.02 to 1.23, 1.03 to 1.22, 1.04 to 1.21, 1.05 to 1.2, or 1.1 to 1.19. In one embodiment, the positive out-of-plane retardations satisfy the relations of $0.8 < R(450)/R(550) < 0.9$ and $1.01 < R(650)/R(550) < 1.2$.

In embodiments disclosed herein, the out-of-plane retardation ($R_{th}$) of the multilayer optical compensation film is from about 50 nm to about 200 nm at the wavelength ($\lambda$) 550 nm; most preferably from about 100 nm to about 150 nm. Preferably, the film thickness is from about 5 to about 30 micron (μm), most preferably from about 5 micron to about 20 micron.

In certain embodiments, the styrenic fluoropolymer film is made by solution casting of a polymer solution comprising a styrenic fluoropolymer having a styrenic moiety of:

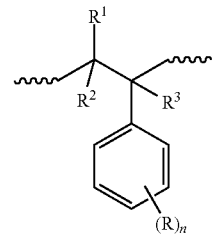

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, wherein each R is independently a substituent on the styrenic ring, n is an integer from 0 to 5 representing the number of the substituents R on the styrenic ring.

The substituent R on the styrenic ring is selected from the group comprising alkyl, substituted alkyl, halogen, hydroxyl, carboxyl, nitro, alkoxy, amino, sulfonate, phosphate, acyl, acyloxy, phenyl, alkoxycarbonyl, cyano, and combinations thereof.

Said styrenic fluoropolymer used to cast the styrenic fluoropolymer film (a) may be a homopolymer such as poly(α,β,β-trifluorostyrene), poly(α,β-difluorostyrene), poly(β,β-difluorostyrene), poly(α-fluorostyrene), or poly(βfluorostyrene). In one embodiment the styrenic fluoropolymer is poly(α,β,β-trifluorostyrene). The styrenic fluoropolymer may also be a copolymer prepared by copolymerization of one or more of the fluorine-containing monomers with one or more of ethylenically unsaturated monomers. Examples of such fluorine-containing monomers include, but are not limited to, α,β,β-trifluorostyrene, α,β-difluorostyrene, β,β-difluorostyrene, α-fluorostyrene, and β-fluorostyrene.

In one embodiment, the styrenic fluoropolymer is a copolymer of α,β,β-trifluorostyrene with one or more of ethylenically unsaturated monomers selected from the group comprising styrene, methyl acrylate, methyl methacrylate, butyl acrylate, butyl methacrylate, 2-ethylhexyl acrylate, acrylic acid, methacrylic acid, α-methyl styrene, 4-methylstyrene, vinyl biphenyl, acrylonitrile, isoprene, and combinations thereof.

In another embodiment, the styrenic fluoropolymer is a nitrated styrenic fluoropolymer having a styrenic moiety of:

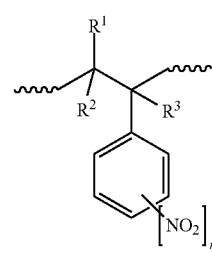

1 wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro group on the styrenic ring.

In the nitrated styrenic fluoropolymer, each styrenic moiety may or may not be substituted (but at least one is substituted); the average number of the nitro group on a styrenic moiety in the polymer can range from about 0.2 to about 1, which is referred to herein as the degree of substitution (DS) of the intro group in the polymer. Desirably, the DS of the nitro group ranges from about 0.5 to about 0.9, from 0.6 to 0.8, or from 0.65 to 0.75.

The nitrated styrenic fluoropolymer may be prepared by nitration of a styrenic fluoropolymer, which may be a homopolymer or a copolymer. Preferably, the nitrated styrenic fluoropolymer, when cast into film, has an out-of-plane birefringence ($\Delta n_{th}$) satisfying the equation of $\Delta n_{th} > 0.02$ or $>0.025$ or $>0.03$, or $>0.035$. Higher birefringence materials have an advantage in that they can provide sufficient positive out-of-plane retardations ($R_{th}$) as thin films to reduce or eliminate the negative $R_{th}$ exhibited in the polyimide film.

In some embodiments disclosed herein, the positive C-plate material is a polymer film cast from a polymer solution including a solvent and a vinyl aromatic polymer, the polymer having one or more moieties selected from the formulae below:

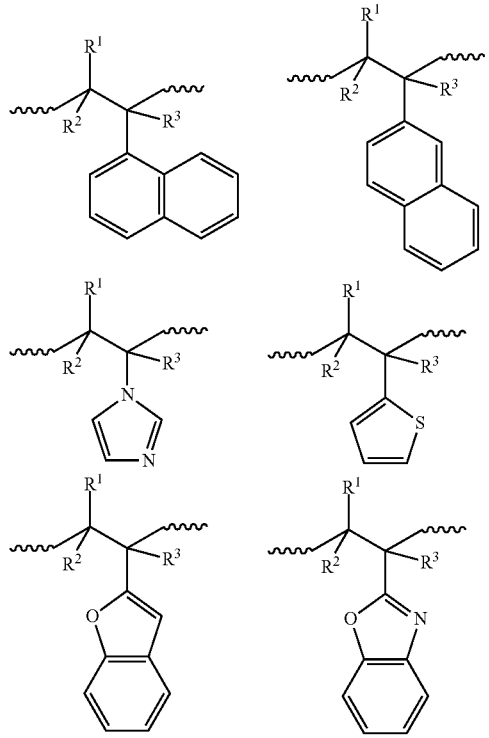

wherein $R^1$, $R^2$, and $R^3$ are each independently hydrogen atoms, alkyl groups, substituted alkyl groups, or halogens, and wherein at least one of $R^1$, $R^2$, and $R^3$ is a fluorine atom. Polymers having one or more such moieties are denoted as vinyl aromatic fluoropolymers throughout the description of this invention. Said vinyl aromatic fluoropolymers may have one or more substituents on their aromatic rings. Examples of the substituents include one or more of alkyl, substituted alkyl, fluoro, chloro, bromo, iodo, hydroxyl, carboxyl, nitro, alkoxy, amino, sulfonate, phosphate, acyl, acyloxy, phenyl, alkoxycarbonyl, cyano, trifluoromethyl, and the like. In some embodiments, the substituent(s) are one or more selected from the group consisting of fluoro, chloro, bromo, iodo, nitro, phenyl, cyano, and trifluoromethyl. In another embodiment, the substituent(s) are nitro.

In embodiments disclosed herein, the polyimide film can be made by solution casting of a polymer solution comprising a polyimide. The polyimide used in this invention contains rigid rod-like groups that are capable of forming out-of-plane orientation when solution cast onto a substrate. The polyimide film thus prepared exhibits negative out-of-plane birefringence and is commonly known as a negative C-plate for optical retardation compensation.

Such polyimides are typically prepared by reacting an aromatic dianhydride with an aromatic diamine. The aromatic dianhydride can be based on benzene (Formulae 2-5, below) or naphthalene (Formulae 6-7, below); the aromatic diamine can also be based on either benzene (Formulae 8 and 9, below) or naphthalene (Formulae 10 and 11, below). Polyimides suitable for this invention have been disclosed in U.S. Pat. Nos. 5,344,916, 5,480,964, 5,580,950, and 7,820,253, the contents of which are incorporated by reference herein in their entirety. Desirably, the polyimides are prepared by reacting one or more of the dianhydrides, such as pyromelliticdianhydride (PMDA) (2), 3,3',4,4'-biphenyltetracarboxylic dianhydride (BPDA) (3), 4,4'-(hexafluoroisopropylidene)-diphthalic anhydride (6FDA) (4), 4,4'-(ethyne-1,2-diyl) diphthalic anhydride (EDDPA) (5), 4,4'-binaphthyl-1,1',8,8'-tetracarboxylic dianhydride (BNDA) (6), and 1,4,5,8-naphthalene-tetracarboxylic dianhydride (NDA) (7), with one or more of the diamines, such as 2,4-diaminomesitylene (DAM) (8), 2,2'-bis(trifluoromethyl) benzidine (PFMB) (9), 1,5-naphthalenediamine (DAN) (10), [1,1'-binaphthalene]-5,5'-diamine (DABN) (11), 3,5-diethyl-toluene-2,6-diamine (2,6-DETDA) (12), 3,5-diethyl-toluene-2,4-diamine (2,4-DETDA) (13), and 4,4'-(9-fluorenylidene)dianiline) (FRDA) (14). The most desirable dianhydrides are 6FDA (4), EDDPA (5), and BNDA (6), and the most desirable diamine are DAM (8), 2,6-DETDA (12), 2,4-DETDA (13), and FRDA (14). In one embodiment, the aromatic dianhydride is selected from the group consisting of 6FDA (4), EDDPA (5), BNDA (6), and combinations thereof, and the aromatic diamine is selected from the group consisting of DAM (8), 2,6-DETDA (12), 2,4-DETDA (13), FRDA (14), and combinations thereof. Various chemical compositions of dianhydrides and aromatic diamines are shown below:

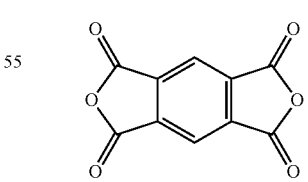

2

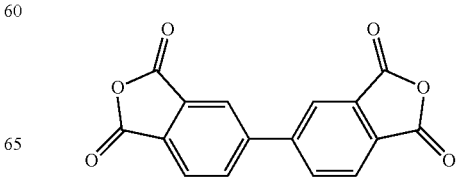

3

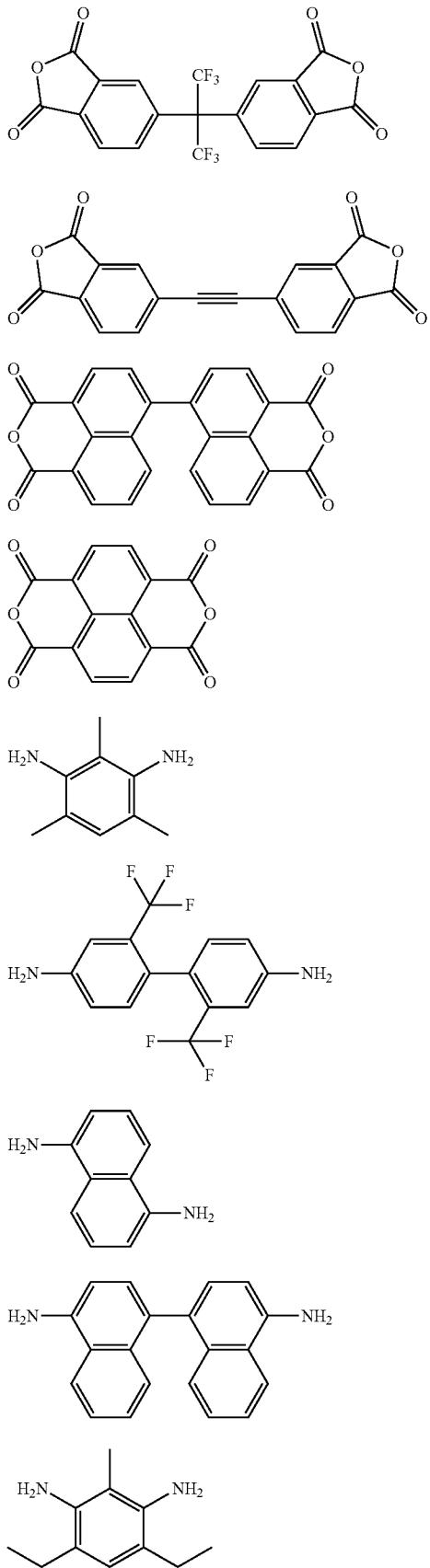
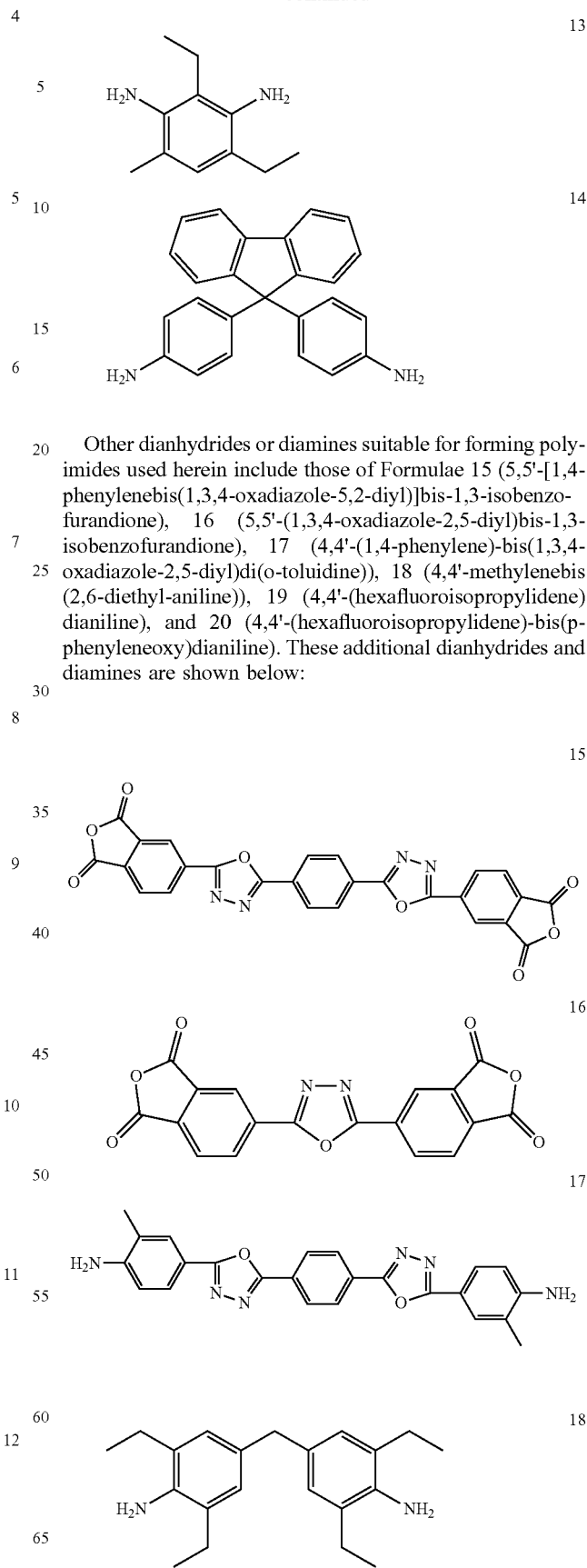

Other dianhydrides or diamines suitable for forming polyimides used herein include those of Formulae 15 (5,5'-[1,4-phenylenebis(1,3,4-oxadiazole-5,2-diyl)]bis-1,3-isobenzofurandione), 16 (5,5'-(1,3,4-oxadiazole-2,5-diyl)bis-1,3-isobenzofurandione), 17 (4,4'-(1,4-phenylene)-bis(1,3,4-oxadiazole-2,5-diyl)di(o-toluidine)), 18 (4,4'-methylenebis(2,6-diethyl-aniline)), 19 (4,4'-(hexafluoroisopropylidene)dianiline), and 20 (4,4'-(hexafluoroisopropylidene)-bis(p-phenyleneoxy)dianiline). These additional dianhydrides and diamines are shown below:

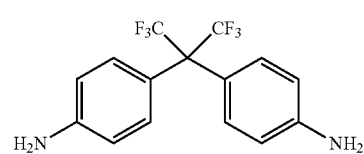

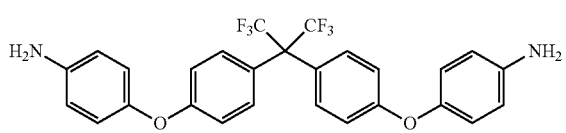

In one embodiment, the styrenic fluoropolymer film is a coating film having been cast on a substrate from a polymer solution comprising a styrenic fluoropolymer and a solvent. The solution-cast polymer film is capable of forming an out-of-plane anisotropic alignment (positive C-plate) upon solvent evaporation without being subject to heat treatment, photo irradiation, or stretching and has a positive out-of-plane birefringence greater than 0.015, greater than 0.02, greater than 0.025, greater than 0.03, or greater than 0.035 throughout the wavelength range of 400 nm<λ<800 nm. The styrenic fluoropolymer film desirably has a thickness of from 3 to 30 μm or from 5 to 15 μm.

For certain embodiments disclosed herein, polymer solution may be prepared by dissolving the styrenic fluoropolymer in a solvent. Suitable solvents include methyl ethyl ketone, cyclopentanone, toluene, methyl isobutyl ketone, methylene chloride, chloroform, 1,2-dichloroethane, methyl amyl ketone, methyl isopropyl ketone, methyl isoamyl ketone, ethyl acetate, n-butyl acetate, propylene glycol methyl ether acetate, and mixtures thereof.

The casting of a polymer solution onto a substrate may be carried out by a method known in the art such as, for example, spin coating, spray coating, roll coating, curtain coating, or dip coating. Substrates are known in the art, which include triacetylcellulose (TAC), cyclic olefin polymer (COP), polyester, polyvinyl alcohol, cellulose ester, cellulose acetate propionate (CAP), polycarbonate, co-polycarbonate, polyacrylate, polyolefin, polyurethane, polystyrene, glass, and other materials commonly used in an LCD device.

In another embodiment, the solution-cast fluoropolymer film is removed from a substrate upon drying to yield a free-standing film. The free-standing film can be attached to an optical film such as, for example, an A-plate, by lamination. Alternatively, the fluoropolymer film on a substrate can be laminated onto an A-plate and the substrate subsequently removed.

In a further embodiment, the polyimide film is a coating film having been cast on the fluoropolymer film from a polymer solution comprising a polyimide. The polymer solution may be prepared by dissolving the polyimide in a solvent. Suitable solvents include methyl ethyl ketone, cyclopentanone, toluene, methyl isobutyl ketone, methylene chloride, chloroform, 1,2-dichloroethane, methyl amyl ketone, methyl isopropyl ketone, methyl isoamyl ketone, ethyl acetate, n-butyl acetate, propylene glycol methyl ether acetate, N,N-dimethylformamide, N,N-dimethylacetamide, and mixtures thereof.

The polyimide film desirably has a thickness of from 1 to 10 μm or from 2 to 5 μm. Preferably, the polyimide film has an out-of-plane birefringence ($\Delta n_{th}$) satisfying the equation of $\Delta n_{th}$<−0.03 or <−0.04 or <−0.05. Higher negative birefringence materials have an advantage in that they can provide more effective reversed wavelength dispersion characteristics with thin films. In some embodiments, the polyimide film is rubbed and aligned to provide desirable orientations to the positive-C material of the first layer such as liquid crystal molecules.

In certain embodiments, a multilayer optical compensation film comprises a first and a second layer. The first layer is a nitrated styrenic fluoropolymer having an average DS ranging from about 0.6 to about 0.8 for the nitro group on the styrenic ring, and the second layer is a polyimide film made by solution casting of a polymer solution comprising a solvent and a polyimide, wherein the polyimide is the reaction product of components comprising:

i. 4,4'-(hexafluoroisopropylidene)-diphthalic anhydride (6FDA) in an amount from about 15 to about 25 molar percent, based on the total moles of (i), (ii), and (iii), ii. 4,4'-(ethyne-1,2-diyl) diphthalic anhydride (EDDPA) in an amount from about 20 to about 30 molar percent, based on the total moles of (i), (ii), and (iii), iii. 4,4'-binaphthyl-1,1',8,8'-tetracarboxylic dianhydride (BNDA) in an amount from about 45 to about 55 molar percent, based on the total moles of (i), (ii), and (iii), and iv. 4,4'-(9-fluorenylidene)dianiline (FRDA).

In another embodiment, the first layer is a nitrated styrenic fluoropolymer having an average DS ranging from about 0.6 to about 0.8 for the nitro group on the styrenic ring and the second layer is a polyimide film made by solution casting of a polymer solution comprising a solvent and a polyimide, wherein the polyimide is the reaction product of the components comprising:

i. 4,4'-(hexafluoroisopropylidene)-diphthalic anhydride (6FDA) in an amount from about 40 to about 48 molar percent, based on the total moles of (i) and (ii), ii. 4,4'-binaphthyl-1,1',8,8'-tetracarboxylic dianhydride (BNDA) in an amount from about 52 to about 60 molar percent, based on the total moles of (i) and (ii), and iii. 4,4'-(9-fluorenylidene)dianiline (FRDA).

In yet another embodiment, the first layer is a nitrated styrenic fluoropolymer having an average DS ranging from about 0.6 to about 0.8 for the nitro group on the styrenic ring, and the second layer is a polyimide film made by solution casting of a polymer solution comprising a solvent and a polyimide, wherein the polyimide is the reaction product of the components comprising:

i. 4,4'-(hexafluoroisopropylidene)-diphthalic anhydride (6FDA) in an amount from about 40 to about 48 molar percent, based on the total moles of (i) and (ii), ii. 4,4'-binaphthyl-1,1',8,8'-tetracarboxylic dianhydride (BNDA) in an amount from about 52 to about 60 molar percent, based on the total moles of (i) and (ii), and iii. 4,4'-(9-fluorenylidene)dianiline (FRDA).

When combined with an A-plate, embodiments disclosed herein can eliminate the undesirable negative out-of-plane retardation present in the A-plate. Further, due to their reversed dispersion characteristics, embodiments of the invention can provide an achromatic compensation for optimal improvement of the viewing quality.

Embodiments described herein further include an optical film comprising the multilayer optical compensation film of the present invention and an A-plate having a refractive index profile of $n_x > n_y = n_z$, wherein $n_x$ and $n_y$ represent in-plane refractive indices, and $n_z$ the thickness refractive index. In one embodiment, said A-plate is a quarter wave plate (QWP). One further embodiment, including a QWP in combination with a linear polarizer functions as a circular polarizer. Such a circular polarizer can be used in an OLED display device to reduce the ambient light and thus improve the viewing quality.

In another embodiment, an optical film comprises the multilayer optical compensation films described herein and a B-plate having a refractive index profile of $n_x>n_y\neq n_z$, wherein $n_x$ and $n_y$ represent in-plane refractive indices, and $n_z$ the thickness refractive index. In one embodiment, said B-plate is a biaxial QWP. In a further embodiment, a biaxial QWP in combination with a linear polarizer functions as a circular polarizer. Such a circular polarizer can be used in an OLED display device to reduce the ambient light and thus improve the viewing quality Such an optical film may be obtained by laminating the multilayer film of the present invention with an A-plate, or by means of solution casting. In one embodiment, the styrenic fluoropolymer film is cast onto an A-plate, followed by the casting of the polyimide film onto the styrenic fluoropolymer film to obtain a multilayer film. In another embodiment, the polyimide film is cast onto the A-plate, followed by the casting of styrenic fluoropolymer film onto the polyimide film to obtain a multilayer film.

Similarly, embodiments of the optical films described herein may also be obtained by laminating the multilayer film of the present invention with a B-plate or by solution casting. In one embodiment, the styrenic fluoropolymer film is cast onto a B-plate, followed by the casting of a polyimide film onto the styrenic fluoropolymer film to obtain a multilayer film. In another embodiment, the polyimide film is cast onto a B-plate, followed by the casting of the styrenic fluoropolymer film onto the polyimide film to obtain the multilayer film.

The optical compensation film of the present invention may be used in a liquid crystal display device including an in-plane switching liquid crystal display device, in an OLED display device, in a 3D display device, in a circular polarizer, or in 3D glasses. Said display devices may be used for television, computer, mobile phone, camera, and the like.

In additional embodiments of the present invention, a polymer resin is provided. The polymer resin has a moiety of:

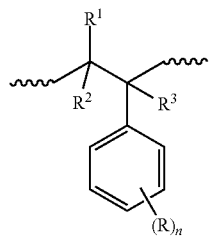

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, wherein each R is independently a substituent on the styrenic ring, and wherein n is an integer from 0 to 5 representing the number of the substituents R on the styrenic ring.

In certain embodiments of the polymer resin, the substituent R on the styrenic ring is selected from one or more of the group consisting of alkyl, substituted alkyl, fluoro, chloro, bromo, iodo, hydroxyl, carboxyl, nitro, alkoxy, amino, sulfonate, phosphate, acyl, acyloxy, phenyl, alkoxycarbonyl, cyano, and trifluoromethyl. In certain embodiments of the polymer resin, the substituent R on the styrenic ring is selected from one or more of bromine (Br) and nitro ($NO_2$). In certain embodiments of the polymer resin, the substituent on the styrenic ring is Br, and the degree of substitution (DS) of Br is greater than 1. In certain embodiments of the polymer resin, the substituent R on the styrenic ring is Br, and the DS of Br is greater than 1.5. In certain embodiments of the polymer resin, the substituent R on the styrenic ring is Br, and the DS of Br is greater than 2. In certain embodiments of the polymer resin, the substituent R on the styrenic ring is nitro, and the DS of nitro is greater than 0.25. In certain embodiments of the polymer resin, the substituent R on the styrenic ring is nitro, and the DS of nitro is greater than 0.4. In certain embodiments of the polymer resin, the substituent R on the styrenic ring is nitro, and the DS of nitro is greater than 0.6. In certain embodiments of the polymer resin, the substituent R on the styrenic ring is nitro, and the DS of nitro is greater than 0.8.

In one embodiment of the present invention, a polymer solution is provided. The polymer solution comprises a solvent and a polymer having a styrenic moiety of:

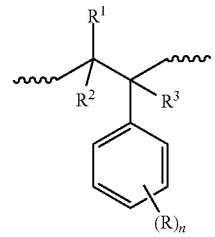

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, wherein each R is independently a substituent on the styrenic ring, and wherein n is an integer from 0 to 5 representing the number of the substituents R on the styrenic ring.

In certain embodiments of the polymer solution, the solvent is selected from the group consisting of: toluene, methyl isobutyl ketone, cyclopentanone, methylene chloride, 1,2-dichloroethane, methyl amyl ketone, methyl ethyl ketone, methyl isoamyl ketone, and mixtures thereof. In certain embodiments of the polymer solution, the solvent is selected from the group consisting of: methyl ethyl ketone, methylene chloride, cyclopentanone, and mixtures thereof.

In certain embodiments of the polymer solution, the substituent R on the styrenic ring of the polymer is selected from one or more of the group consisting of alkyl, substituted alkyl, fluoro, chloro, bromo, iodo, hydroxyl, carboxyl, nitro, alkoxy, amino, sulfonate, phosphate, acyl, acyloxy, phenyl, alkoxycarbonyl, cyano, and trifluoromethyl. In certain embodiments of the polymer solution, the substituent R on the styrenic ring of the polymer is selected from one or more of bromine (Br) and nitro ($NO_2$). In certain embodiments of the polymer solution, the substituent on the styrenic ring of the polymer is Br, and the degree of substitution (DS) of Br is greater than 1. In certain embodiments of the polymer solution, the substituent R on the styrenic ring of the polymer is Br, and the DS of Br is greater than 1.5. In certain embodiments of the polymer solution, the substituent R on the styrenic ring of the polymer is Br, and the DS of Br is greater than 2. In certain embodiments of the polymer solution, the substituent R on the styrenic ring of the polymer is nitro, and the DS of nitro is greater than 0.25. In certain embodiments of the polymer solution, the substituent R on the styrenic ring of the polymer is nitro, and the DS of nitro is greater than 0.4. In certain embodiments of the polymer solution, the substituent R on the styrenic ring of the polymer is nitro, and the DS of nitro is greater than 0.6. In certain embodiments of the polymer solution, the substituent R on the styrenic ring of the polymer is nitro, and the DS of nitro is greater than 0.8.

When any of the resins described herein is combined with a solvent described herein to form a solution and then solution-cast as a film, the film formed from the resin exhibits the properties in accordance with the other embodiments disclosed herein.

Certain embodiments disclosed herein relate to multilayer optical films having reversed wavelength dispersions that satisfy the relations of 0.7<R(450)/R(550)<1 and 1<R(650)/R(550)<1.25. In some embodiments, the two values, R(450)/R(550) and R(650)/R(550), can both be close to 1, in which case the wavelength dispersion curve is nearly flat. Such an optical film having a flat dispersion can also have utility in providing improved viewing quality.

In a further embodiment of the present invention, a multilayer optical compensation film comprises, (c) a styrenic fluoropolymer film and
(d) a polyimide film, wherein said multilayer optical compensation film has positive out-of-plane retardations that satisfy the relations of 0.98<R(450)/R(550)<1.02 and 0.98<R(650)/R(550)<1.02, wherein R(450), R(550), and R(550) are out-of-plane retardations at the light wavelengths of 450 nm, 550 nm, and 650 nm respectively. In this embodiment, said styrenic fluoropolymer is a poly($\alpha,\beta,\beta$-trifluorostyrene) or a nitrated poly($\alpha,\beta,\beta$-trifluorostyrene).

EXAMPLES

The following examples describe and demonstrate exemplary embodiments of the polymers, polymer solutions, polymer films, and methods described herein. The exemplary embodiments are provided solely for the purpose of illustration and are not to be construed as limitations of the present disclosure, as many variations thereof are possible without departing from the spirit and scope of the present disclosure.

Example 1. Synthesis of Nitrated Poly($\alpha,\beta,\beta$-trifluorostyrene) (N-PTFS) Having DS=0.68

Materials: Poly($\alpha,\beta,\beta$-trifluorostyrene) (PTFS) was an internal product with an intrinsic viscosity (IV) of 1.10 dL/g, used as received. Dichloromethane (DCM) was from Acros, purified by passing through $SiO_2$. $HNO_3$ was from Acros (68%-70%), used as received. $H_2SO_4$ was from Sigma Aldrich (95.0%-98.0%), used as received.

To a one-liter three-neck round-bottom flask equipped with nitrogen inlet/outlet and a mechanical stirrer was charged a solution of PTFS (IV, 1.10 dL/g) in dichloromethane (DCM) (200 g, 5 weight %). Separately, a mixed acid solution was prepared by adding concentrated sulfuric acid (31.18 g) to nitric acid (11.75 g). The flask was placed in a water bath at room temperature. To the stirred PTFS solution in the flask was added the mixed acid over a period of 10 minutes. The reaction mixture was allowed to react at room temperature for 23 hours and subsequently quenched by adding deionized water/ice (500 ml). The water phase at the top was then decanted and the organic phase washed repeatedly with deionized water to remove the acids. The resulting organic layer was precipitated into methanol (about one liter) and ground in a high speed blender to yield a powder suspension. The powder was then filtered and washed repeatedly with water and methanol. The resulting product was dried at 80° C. under reduced pressure overnight. Intrinsic viscosity (IV) of the polymer was 1.20 dL/g, measured by a Cannon® auto capillary viscometer using N-methyl-2-pyrrolidone (NMP) as the solvent at 30° C. The degree of substitution (DS) of the nitro group in the product was determined to be 0.68 by elemental analysis (EA).

Example 2. Synthesis of Polyimide 1 (EDDPA/DETDA, 100/100)

Polyimide 1 (EDDPA/DETDA, 100/100 molar ratio) was prepared by reacting 4,4'-(ethyne-1,2-diyl) diphthalic anhydride (EDDPA) with an equal mole of DETDA (a mixture of 3,5-diethyl-toluene-2,6-diamine (2,6-DETDA) and 3,5-diethyl-toluene-2,4-diamine (2,4-DETDA)). To a 100 ml three-neck round-bottom flask equipped with nitrogen inlet/outlet and a mechanical stirrer were charged N,N-dimethylacetamide (DMAc) (22 ml), EDDPA (3.2945 g, 5.00 mmol), and DETDA (2.1790 g, 4.91 mmol). The reaction mixture was allowed to react at room temperature for 18 hours, followed by the addition of pyridine (1.0 ml) and acetic anhydride (2.5 ml). The reaction was allowed to continue at 120° C. for two hours. After cooling down, the resulting solution was precipitated into methanol (about 100 ml) to yield a fibrous product. The product was then filtered and washed repeatedly with methanol. The resulting product was dried at 80° C. under reduced pressure overnight. Intrinsic viscosity (IV) of the polymer was 0.52 dL/g, measured by a Cannon® auto capillary viscometer using N-methyl-2-pyrrolidone (NMP) as the solvent at 30° C.

Example 3. Preparation of Multilayer Optical Films Cast from Solutions of N-PTFS and Polyimide 1 (EDDPA/DETDA, 100/100)

Polymer solutions were prepared by using N-PTFS and polyimide 1 (EDDPA/DETDA, 100/100) respectively. A 10 wt. % solution of N-PTFS was prepared by dissolving N-PTFS solid in methyl ethyl ketone (MEK). Separately, a 10 wt. % solution of polyimide 1 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 4. Preparation of Multilayer Optical Films Cast from Solutions of PTFS and Polyimide 1 (EDDPA/DETDA, 100/100)

Polymer solutions were prepared by using PTFS and polyimide 1 (EDDPA/DETDA, 100/100) respectively. A 10 wt. % solution of PTFS was prepared by dissolving PTFS solid in methyl ethyl ketone (MEK). Separately, a 10 wt. % solution of polyimide 1 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the PTFS solution was cast onto the polyimide. The resulting bi-layer film was allowed to dry at room temperature for one hour and subsequently placed in a vacuum oven at 150° C. for 2 hours. The multilayer film thus obtained was peeled off from the glass substrate.

Example 5. Properties of Multilayer Optical Films of N-PTFS/Polyimide 1 and PTFS/Polyimide 1

Birefringence and thickness of the free standing films were measured by the Metricon Model 2010/M Prism Coupler using single film mode at a wavelength of 633 nm. The retardation and the dispersion were determined by the J. A. Woollam RC2 Ellipsometry. The birefringence at 633 nm, the thickness, and the dispersion factors $R_{th}(450)/R_{th}(550)$ and $R_{th}(650)/R_{th}(550)$ are listed in Table 1.

TABLE 1

Multilayer Optical Films of N-PTFS/Polyimide 1 and PTFS/Polyimide 1

| | Metricon on PI side | | | Metricon on C+ side | | $d^{PI}$ + | Multilayer Film | | |
| --- | --- | --- | --- | --- | --- | --- | --- | --- | --- |
| Film ID | Polyimide 1 (PI-1) | $\Delta n^{633nm}$ | $d^{PI}$ μm | C+ | $\Delta n^{633nm}$ | $d^{C+}$ μm | $d^{C+}$ μm | Rth nm | R(450)/ R(550) | d μm |
| 1 | EDDPA/ | −0.0477 | 4.5 | N-PTFS | 0.0306 | 8.1 | 12.6 | 71 | 0.610 | 11.2 |
| 2 | DETDA | −0.0473 | 4.3 | | 0.0298 | 7.6 | 11.9 | 121 | 0.836 | 11.6 |
| 3 | 100/100 | −0.0469 | 3.9 | PTFS | 0.0182 | 13.9 | 17.8 | 158 | 0.799 | 17.0 |
| 4 | (IV = 0.52) | −0.0454 | 3.9 | | 0.0182 | 17.0 | 20.9 | 160 | 0.834 | 19.4 |
| 5 | | −0.0445 | 3.9 | | 0.0182 | 22.6 | 26.5 | 173 | 0.834 | 20.5 |

Example 6. Synthesis of Polyimide 2 (6FDA/BNDA/DAM, 50/50/100)

To a 100 ml three-neck round-bottom flask equipped with nitrogen inlet/outlet and a mechanical stirrer were charged DMAc (24 ml), DAM (1.5037 g, 10.01 mmol), 4,4'-binaphthalic-1,1'-8,8'-tetracarboxylic dianhydride (BNDA) (1.9717 g, 5.00 mmol), and 6FDA (2.2285 g, 502 mmol). The reaction mixture was allowed to react at room temperature for 18 hours, followed by the addition of pyridine (2.0 ml) and acetic anhydride (5.0 ml). The reaction was allowed to continue at 120° C. for two hours. After cooling down, the resulting solution was precipitated into methanol (about 100 ml) to yield a fibrous product. The product was then filtered and washed repeatedly with methanol. The resulting product was dried at 80° C. under reduced pressure overnight. Intrinsic viscosity (IV) of the polymer was 1.35 dL/g, measured by a Cannon® auto capillary viscometer using N-methyl-2-pyrrolidone (NMP) as the solvent at 30° C.

Example 7. Preparation of Multilayer Optical Films Cast from Solutions of N-PTFS and Polyimide 2 (6FDA/BNDA/DAM, 50/50/100)

Polymer solutions were prepared by using N-PTFS and polyimide 2 (6FDA/BNDA/DAM, 50/50/100) respectively. A 10 wt. % solution of N-PTFS was prepared by dissolving N-PTFS solid in methyl ethyl ketone (MEK). Separately, a 10 wt. % solution of polyimide 2 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 8. Preparation of Multilayer Optical Films Cast from Solutions of PTFS and Polyimide 2 (6FDA/BNDA/DAM, 50/50/100)

Polymer solutions were prepared by using PTFS and polyimide 2 (6FDA/BNDA/DAM, 50/50/100) respectively. A 10 wt. % solution of PTFS was prepared by dissolving PTFS solid in methyl ethyl ketone (MEK). Separately, a 10 wt. % solution of polyimide 2 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 9. Properties of Multilayer Optical Films of N-PTFS/Polyimide 2 and PTFS/Polyimide 2

Birefringence and thickness of the free standing films were measured by the Metricon Model 2010/M Prism Coupler using single film mode at a wavelength of 633 nm. The retardation and the dispersion were determined by the J. A. Wool lam M-2000 Ellipsometry. The birefringence at 633 nm, the thickness, the dispersion factors $R_{th}(450)/R_{th}(550)$ and $R_{th}(650)/R_{th}(550)$ are listed in Table 2.

TABLE 2

Multilayer Optical Films of N-PTFS/Polyimide 2 and PTFS/Polyimide 2

| | Metricon on PI side | | | Metricon on C+ side | | | $d^{PI}+$ | Multilayer Film | | |
|---|---|---|---|---|---|---|---|---|---|---|
| Film ID | Polyimide 2 (PI-1) | $\Delta n^{633nm}$ | $d^{PI}$ μm | C+ | $\Delta n^{633nm}$ | $d^{C+}$ μm | $d^{C+}$ μm | Rth nm | R(450)/ R(550) | d μm |
| 6 | 6FDA/ | −0.0328 | 3.0 | N-PTFS | 0.0313 | 6.0 | 9.0 | 101 | 0.977 | 9.6 |
| 7 | BNDA/DAM | −0.0316 | 3.2 | PTFS | 0.0186 | 9.5 | 12.7 | 90 | 0.840 | 12.3 |
| 8 | 50/50/100 | −0.0308 | 3.2 | | 0.0178 | 10.4 | 13.6 | 86 | 0.933 | 12.1 |
| 9 | (IV = 1.07) | −0.0307 | 3.3 | | 0.0180 | 11.7 | 15.0 | 125 | 0.974 | 13.8 |

Example 10. Synthesis of Polyimide 3 (6FDA/EDDPA/DETDA, 1.5/98.5/100)

Polyimide 3 having the composition of 6FDA/EDDPA/DETDA was prepared according to the method in Example 2 by using 6FDA, EDDPA, and DETDA at a molar ratio of 1.5/98.5/100.

Example 11. Preparation of Multilayer Optical Films Cast from Solutions of N-PTFS and Polyimide 3(6FDA/EDDPA/DETDA, 1.5/98.5/100)

Polymer solutions were prepared by using N-PTFS and polyimide 3 (6FDA/EDDPA/DETDA, 1.5/98.5/100) respectively. A 12 wt. % solution of PTFS was prepared by dissolving N-PTFS solid in methyl ethyl ketone (MEK). Separately, a 12 wt. % solution of polyimide 3 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 12. Properties of Multilayer Optical Films of N-PTFS/Polyimide 3

By using the method in Example 11, a bilayer film of N-PTFS/Polyimide 3 (PI 3) was cast and its optical properties measured. From the results, the retardation values of a series of bilayer films with variation in the thickness of each layer was calculated as listed in Table 3.

TABLE 3

Multilayer Optical Films of N-PTFS/Polyimide 3

| Film ID | d, total (μm) | PI 3, d (μm) | N-PTFS, d (μm) | $R_{th}(450)/R_{th}(550)$ | $R_{th}(650)/R_{th}(550)$ | $R_{th}$ (nm) |
|---|---|---|---|---|---|---|
| 10 | 6.4 | 0.8 | 5.6 | 1.016 | 0.989 | 137.12 |
| 11 | 6.6 | 0.9 | 5.7 | 1.008 | 0.993 | 134.27 |
| 12 | 7.0 | 1.0 | 6.0 | 1.002 | 0.996 | 138.07 |
| 13 | 8.0 | 1.4 | 6.6 | 0.970 | 1.011 | 133.31 |
| 14 | 8.3 | 1.5 | 6.8 | 0.963 | 1.014 | 133.78 |
| 15 | 9.4 | 1.9 | 7.5 | 0.931 | 1.029 | 132.35 |
| 16 | 9.5 | 2.0 | 7.5 | 0.915 | 1.037 | 126.16 |
| 17 | 10.2 | 2.2 | 8.0 | 0.905 | 1.042 | 130.44 |
| 18 | 11.0 | 2.5 | 8.5 | 0.878 | 1.054 | 128.53 |
| 19 | 11.8 | 2.8 | 9.0 | 0.850 | 1.068 | 126.63 |
| 20 | 12.1 | 2.9 | 9.2 | 0.843 | 1.071 | 127.10 |
| 21 | 12.8 | 3.1 | 9.7 | 0.834 | 1.075 | 131.38 |
| 22 | 13.3 | 3.3 | 10 | 0.813 | 1.085 | 129.00 |

Example 13. Synthesis of Polyimide 4 (EDDPA/DETDA/FRDA, 100/50/50)

Polyimide 4 having the composition of EDDPA/DETDA/FRDA was synthesized according to the method in Example 2 by using EDDPA, DETDA, and 4,4'-(9-fluorenylidene) dianiline (FRDA) at a molar ratio of 100/50/50.

Example 14. Properties of Multilayer Optical Films of N-PTFS/Polyimide 4

By using the method in Example 11, a bilayer film of N-PTFS/Polyimide 4 (PI 4) was cast and its optical properties measured. From the results, the retardation values of a series of bilayer films with variation in the thickness of each layer was calculated as listed in Table 4.

TABLE 4

Multilayer Optical Films of N-PTFS/Polyimide 4

| Film ID | d, total (μm) | PI 4, d (μm) | N-PTFS, d (μm) | $R_{th}(450)/R_{th}(550)$ | $R_{th}(650)/R_{th}(550)$ | $R_{th}$ (nm) |
|---|---|---|---|---|---|---|
| 23 | 5.6 | 0.6 | 5.0 | 1.005 | 0.985 | 131.37 |
| 24 | 6.25 | 0.75 | 5.5 | 0.993 | 0.989 | 139.21 |
| 25 | 6.8 | 1 | 5.8 | 0.962 | 0.999 | 134.51 |
| 26 | 7.1 | 1.1 | 6.0 | 0.952 | 1.003 | 135.29 |
| 27 | 7.3 | 1.2 | 6.1 | 0.938 | 1.008 | 132.74 |
| 28 | 7.8 | 1.4 | 6.4 | 0.912 | 1.016 | 130.98 |
| 29 | 8.7 | 1.7 | 7.0 | 0.880 | 1.027 | 133.33 |
| 30 | 9.0 | 1.8 | 7.2 | 0.870 | 1.031 | 134.12 |
| 31 | 9.6 | 2.0 | 7.6 | 0.849 | 1.038 | 135.69 |
| 32 | 9.8 | 2.1 | 7.7 | 0.833 | 1.043 | 133.14 |
| 33 | 10.0 | 2.2 | 7.8 | 0.816 | 1.049 | 130.59 |
| 34 | 10.3 | 2.3 | 8.0 | 0.805 | 1.053 | 131.37 |

Example 15: Synthesis of Nitrated Poly(α,β-trifluorostyrene) (N-PTFS 2) Having DS=0.72

Poly(α,β,β-trifluorostyrene) (PTFS; IV, 1.10 dL/g) (1.2 kg) was mixed with 1,2-dichloroethane (13.8 kg) in a 19 L reactor under nitrogen. The mixture was heated to 50° C. with agitation. Once all solids dissolved, the mixture was further heated to 55° C., after which a pre-made mixture of sulfuric acid (98%, 2.89 kg) and nitric acid (69%, 1.12 kg) was added in 2.5 hours. The mixture was then heated to 60° C. and held for 4 hours. Propionic acid (13.3 kg) was added to precipitate the product while the mixture was being cooled to room temperature. The resulting suspension was filtered, and the crude powder product was washed first with propionic acid twice and then with methanol repeatedly. The resulting product was dried at 60° C. under reduced pressure to give 1.3 kg powder product. The degree of substitution (DS) of the nitro group in the product was determined to be 0.72 by elemental analysis (EA).

Example 16. Synthesis of Polyimide 5 (6FDA/EDDPA/BNDA/FRDA, 18/25/50/100)

FRDA-BNDA-FRDA diamine was prepared by reacting 4,4'-binaphthyl-1,1',8,8'-tetracarboxylic dianhydride (BNDA) with an excess of 4,4'-(9-fluorenylidene)dianiline (FRDA) (molar ratio FRDA/BNDA>2.5) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

To a 100 ml three-neck round-bottom flask equipped with nitrogen inlet/outlet and a mechanical stirrer were charged DMAc (26 ml), FRDA-BNDA-FRDA (3.166 g, 3.00 mmol), EDDPA (0.477 g, 1.50 mmol) and 6FDA (0.486 g, 1.09 mmol). The reaction mixture was allowed to react at room temperature for 18 hours, followed by the addition of pyridine (0.6 ml) and acetic anhydride (1.5 ml). The reaction was allowed to continue at 120° (for two hours. After cooling down, the resulting solution was precipitated into methanol (about 200 ml) to yield a fibrous product. The product was then filtered and washed repeatedly with methanol. The resulting product was dried at 80° C. under reduced pressure overnight. Intrinsic viscosity (IV) of the polymer was 0.71 dL/g, measured by a Cannon® auto capillary viscometer using N-methyl-2-pyrrolidone (NMP) as the solvent at 30° C.

Example 17. Preparation of Multilayer Optical Films Cast from Solutions of N-PTFS (or PTFS) and Polyimide 5 (6FDA/EDDPA/BNDA/FRDA, 18/25/50/100)

Polymer solutions were prepared by using N-PTFS 2 (DS=0.72) (or PTFS) and polyimide 5 (6FDA/EDDPA/BNDA/FRDA, 18/25/50/100). A 10 wt. % solution of N-PTFS (or PTFS) was prepared by dissolving polymer solid in methyl ethyl ketone (MEK). Separately, a 10 wt. % solution of polyimide 5 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS (or PTFS) solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 18. Properties of Multilayer Films of N-PTFS/Polyimide 5 and PTFS/Polyimide 5

The bilayer film of N-PTFS/Polyimide 5 (or PTFS/Polyimide 5 (PI 5)) was cast as described in Example 17 and its optical properties measured by using the method in Example 5. From the results, the retardation values of a series of bilayer films with variation in the thickness of each layer can be calculated. The retardation and the dispersion were determined by the J. A. Woollam RC2 Ellipsometry. The thickness, and the dispersion factors $R_{th}(450)/R_{th}(550)$ and $R_{th}(650)/R_{th}(550)$ are listed in Table 5.

TABLE 5

Multilayer Optical Films of N-PTFS/Polyimide 5 and PTFS/Polyimide 5

| Film ID | d, total (μm) | PI 5, d (μm) | C+ Polymer | C+ d(μm) | $R_{th}(450)/R_{th}(550)$ | $R_{th}(650)/R_{th}(550)$ | $R_{th}$ (nm) |
|---|---|---|---|---|---|---|---|
| 35 | 5.7 | 2.2 | N-PTFS | 3.5 | 0.53 | 1.14 | 51 |
| 36 | 6.9 | 2.2 | DS = | 4.7 | 0.76 | 1.07 | 90 |
| 37 | 7.6 | 2.2 | 0.72 | 5.4 | 0.85 | 1.03 | 117 |
| 38 | 8.9 | 2.3 | | 6.6 | 0.91 | 1.01 | 155 |
| 39 | 10.6 | 2.3 | | 8.3 | 0.97 | 0.99 | 215 |
| 40 | 12.3 | 2.3 | | 10.0 | 0.98 | 0.99 | 263 |
| 41 | 5.6 | 1.0 | PTFS | 4.6 | 0.80 | 1.05 | 49 |
| 42 | 5.8 | 1.0 | | 4.8 | 0.82 | 1.04 | 53 |
| 43 | 6.2 | 1.0 | | 5.2 | 0.85 | 1.03 | 60 |
| 44 | 7.1 | 1.0 | | 6.1 | 0.90 | 1.02 | 77 |
| 45 | 8.8 | 1.0 | | 7.8 | 0.95 | 1.00 | 109 |
| 46 | 12.7 | 1.0 | | 11.7 | 1.00 | 0.99 | 182 |

Example 19. Synthesis of Polyimide 6 (6FDA/BNDA/FRDA, 26/67/100)

FRDA-BNDA-FRDA-BNDA-FRDA (this structure is only used to represent the average structure) diamine was prepared by reacting 4,4'-binaphthyl-1,1',8,8'-tetracarboxylic dianhydride (BNDA) with 4,4'-(9-fluorenylidene)dianiline (FRDA) (exact molar ratio FRDA/BNDA=3/2) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

To a 100 ml three-neck round-bottom flask equipped with nitrogen inlet/outlet and a mechanical stirrer was charged DMAc (20 ml), FRDA-BNDA-FRDA-BNDA-FRDA (3.524 g, 2.00 mmol), and 6FDA (0.700 g, 1.58 mmol), The reaction mixture was allowed to react at room temperature for 18 hours, followed by the addition of pyridine (0.4 ml) and acetic anhydride (1.0 ml). The reaction was allowed to continue at 120° C. for two hours. After cooling down, the resulting mixture was precipitated into methanol (about 200 ml). The product was then filtered and washed repeatedly with methanol. The resulting product was dried at 80° C. under reduced pressure overnight. Intrinsic viscosity (IV) of the polymer was 0.78 dL/g, measured by a. Cannon® auto capillary viscometer using N-methyl-2-pyrrolidone (NMP) as the solvent at 30° C.

Example 20. Preparation of Multilayer Optical Films Cast from Solutions of N-PTFS and Polyimide 6 (6FDA/BNDA/FRDA, 26/67/100)

Polymer solutions were prepared by using N-PTFS 2 (DS=0.72) and polyimide 6 (6FDA/BNDA/FRDA, 26/67/100) respectively. A 10 wt. % solution of N-PTFS was prepared by dissolving N-PTFS solid in methyl ethyl ketone (MEK). Separately, a 10 wt. % solution of polyimide 6 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 21. Properties of Multilayer Optical Films of N-PTFS/Polyimide 6

The bilayer film of N-PTFS/Polyimide 6 (or PTFS/Polyimide 6 (PI 6)) was cast as described in Example 20 and its optical properties measured by using the method in Example 5. The retardation and the dispersion were determined by the J.A. Woollam RC2 Ellipsometry. The thickness, and the dispersion factors $R_{th}(450)/R_{th}(550)$ and $R_{th}(650)/R_{th}(550)$ are listed in Table 6.

TABLE 6

Multilayer Optical Films of N-PTFS/Polyimide 6

| Film ID | d, total (μm) | PI 6, d (μm) | N-PTFS, d (μm) | $R_{th}(450)/R_{th}(550)$ | $R_{th}(650)/R_{th}(550)$ | $R_{th}$ (nm) |
|---|---|---|---|---|---|---|
| 47 | 6.9 | 2.5 | 4.4 | 0.79 | 1.03 | 92 |
| 48 | 8.3 | 2.5 | 5.8 | 0.89 | 1.00 | 137 |
| 49 | 9.2 | 2.5 | 6.7 | 0.93 | 0.99 | 168 |
| 50 | 11.2 | 2.6 | 8.6 | 0.97 | 0.99 | 241 |
| 51 | 12.6 | 2.7 | 9.9 | 0.98 | 0.98 | 274 |

Example 22. Synthesis of Polyimide 7 (6FDA/BNDA/FRDA, 43/50/100)

FRDA-BNDA-FRDA diamine was prepared by reacting 4,4'-binaphthyl-1,1',8,8'-tetracarboxylic dianhydride (BNDA) with an excess of 4,4'-(9-fluorenylidene)dianiline (FRDA) (molar ratio FRDA/BNDA>2.5) in m-cresol at 180° C. for 18 hours. The reaction solution was precipitated into an excess of methanol to yield a powder product. The product was then filtered and washed repeatedly with methanol. The resulting product was dried at 80° C. under reduced pressure overnight and ready for the next step polymerization.

To a 100 ml three-neck round-bottom flask equipped with nitrogen inlet/outlet and a mechanical stirrer was charged DMAc (20 ml), FRDA-BNDA-FRDA (3,166 g, 3.00 mmol), and 6FDA (1.163 g, 2.62 mmol). The reaction mixture was allowed to react at room temperature for 18 hours, followed by the addition of pyridine (1.0 ml) and acetic anhydride (2.5 ml). The reaction was allowed to continue at 120° C. for two hours. After cooling down, the resulting solution was precipitated into methanol (about 200 ml) to yield a fibrous product. The product was then filtered and washed repeatedly with methanol. The resulting product was dried at 80° C. under reduced pressure overnight. Intrinsic viscosity (IV) of the polymer was 0.63 dL/g, measured by a Cannon® auto capillary viscometer using N-methyl-2-pyrrolidone (NMP) as the solvent at 30° C.

Example 23. Preparation of Multilayer Optical Films Cast from Solutions of N-PTFS and Polyimide 7 (6FRDA/BNDA/FRDA, 43/50/100)

Polymer solutions were prepared by using N-PTFS 2 (DS=0.72) and polyimide 7 (6FDA/BNDA/FRDA, 43/50/100) respectively. A 10 wt. % solution of N-PTFS was prepared by dissolving N-PTFS solid in methyl ethyl ketone (MEK). Separately, a 10 wt. % solution of polyimide 7 was prepared in cyclopentanone. The polyimide solution was cast onto a flat glass substrates using the blade casting method. The resulting coating film was allowed to dry at room temperature for one hour and subsequently placed in a vacuum oven at 150° C. for 2 hours. After drying, the N-PTFS solution was cast onto the polyimide film. The resulting bi-layer film was allowed to dry at room temperature for one hour and subsequently placed in a vacuum oven at 150° C. for 2 hours. The multilayer film thus obtained was peeled off from the glass substrate.

Example 24. Properties of Multilayer Optical Films of N-PTFS/Polyimide 7

The bilayer film of N-PTFS/Polyimide 7 (or PTFS/Polyimide 7 (PI 7)) was cast as described in Example 23 and its optical properties measured by using the method in Example 5. The retardation and the dispersion were determined by the J. A. Woollam RC2 Ellipsometry. The thickness, and the dispersion factors $R_{th}(450)/R_{th}(550)$ and $R_{th}(650)/R_{th}(550)$ are listed in Table 7.

TABLE 7

Multilayer Optical Films of N-PTFS/Polyimide 7

| Film ID | d, total (μm) | PI 7, d (μm) | N-PTFS, d (μm) | $R_{th}(450)/R_{th}(550)$ | $R_{th}(650)/R_{th}(550)$ | $R_{th}$ (nm) |
|---|---|---|---|---|---|---|
| 52 | 7.7 | 3.3 | 4.4 | 0.70 | 1.06 | 72 |
| 53 | 8.7 | 3.3 | 5.4 | 0.86 | 1.01 | 106 |
| 54 | 10.4 | 3.3 | 7.1 | 0.88 | 1.02 | 149 |

The terminology as set forth herein is for description of the embodiments only and should not be construed as limiting the disclosure as a whole. All references to singular characteristics or limitations of the present disclosure shall include the corresponding plural characteristic or limitation, and vice versa, unless otherwise specified or clearly implied to the contrary by the context in which the reference is made. Unless otherwise specified, "a," "an," "the," and "at least one" are used interchangeably. Furthermore, as used in the description and the appended claims, the singular forms "a," "an," and "the" are inclusive of their plural forms, unless the context clearly indicates otherwise.

All percentages, parts, and ratios as used herein are by weight of the total composition, unless otherwise specified. AH such weights as they pertain to listed ingredients are based on the active level and, therefore, do not include solvents or by-products that may be included in commercially available materials, unless otherwise specified.

All ranges and parameters, including but not limited to percentages, parts, and ratios, disclosed herein are understood to encompass any and all sub-ranges assumed and subsumed therein, and every number between the endpoints. For example, a stated range of "1 to 10" should be considered to include any and all sub-ranges beginning with a minimum value of 1 or more and ending with a maximum value of 10 or less (e.g., 1 to 6.1, or 2.3 to 9.4), and to each integer (1, 2, 3, 4, 5, 6, 7, 8, 9, and 10) contained within the range.

Any combination of method or process steps as used herein may be performed in any order, unless otherwise specified or clearly implied to the contrary by the context in which the referenced combination is made.

To the extent that the terms "include," "includes," or "including" are used in the specification or the claims, they are intended to be inclusive in a manner similar to the term "comprising" as that term is interpreted when employed as a transitional word in a claim. Furthermore, to the extent that the term "or" is employed (e.g., A or B), it is intended to mean "A or B or both A and B." When the applicants intend to indicate "only A or B but not both," then the term "only A or B but not both" will be employed. Thus, use of the term "or" herein is the inclusive, and not the exclusive use. In the present disclosure, the words "a" or "an" are to be taken to include both the singular and the plural. Conversely, any reference to plural items shall, where appropriate, include the singular.

In certain embodiments, it may be possible to utilize the various inventive concepts in combination with one another (e.g., one or more of the various embodiments may be utilized in combination with each other). Additionally, any particular element recited as relating to a particularly disclosed embodiment should be interpreted as available for use with all disclosed embodiments, unless incorporation of the particular element would be contradictory to the express terms of the embodiment. Additional advantages and modifications will be readily apparent to those skilled in the art. Therefore, the disclosure, in its broader aspects, is not limited to the specific details presented therein, the representative apparatus, or the illustrative examples shown and described. Accordingly, departures may be made from such details without departing from the spirit or scope of the general inventive concepts.

The invention claimed is:

1. A multilayer optical compensation film comprising,
a first layer comprising a positive C-plate material and
a second layer comprising a polyimide,
wherein said multilayer optical compensation film has positive out-of-plane retardations that satisfy the relations of $0.7<R(450)/R(550)<1$ and $1<R(650)/R(550)<1.25$, wherein $R(450)$, $R(550)$, and $R(650)$ are out-of-plane retardations at the light wavelengths of 450 nm, 550 nm, and 650 nm respectively, and wherein said positive C-plate material is a material capable of providing a positive out-of-plane birefringence of greater than 0.015 throughout a light wavelength range of from 400 nm to 800 nm.

2. The multilayer optical compensation film of claim 1, wherein said positive C-plate material is selected from the group consisting of liquid crystal molecules, polyacrylate, polyester, cellulose ester, mesogen-jacketed polymer, styrenic polymer, styrenic fluoropolymer, and vinyl aromatic fluoropolymer, and combinations thereof.

3. The multilayer optical compensation film of claim 1, wherein said positive C-plate material has a positive out-of-plane birefringence of greater than 0.02 throughout the light wavelength range of from 400 nm to 800 nm.

4. The multilayer optical compensation film of claim 1, wherein the first layer is a styrenic fluoropolymer film and the second layer is a polyimide film.

5. The multilayer optical film of claim 4, wherein the first layer is made by a solution cast of a polymer solution comprising a styrenic fluoropolymer having a styrenic moiety of:

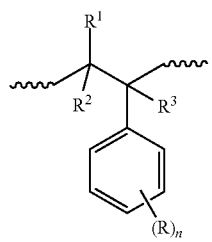

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein R is a number, n, of substituent on the styrenic ring with n being an integer from 0 to 5 representing the number of the substituents R on the styrenic ring.

6. The multilayer optical film of claim 5, wherein the substituent R on the styrenic ring is selected from the group consisting of alkyl, substituted alkyl, halogen, hydroxyl, carboxyl, nitro, alkoxy, amino, sulfonate, phosphate, acyl, acyloxy, phenyl, alkoxycarbonyl, and cyano.

7. The multilayer optical compensation film of claim 4, wherein the styrenic fluoropolymer is poly($\alpha,\beta,\beta$-trifluorostyrene).

8. The multilayer optical film of claim 4, wherein the styrenic fluoropolymer is a nitrated styrenic fluoropolymer having a styrenic moiety of:

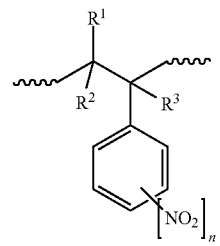

wherein $R^1$, $R^2$, and $R^3$ are each independently hydrogen atoms, alkyl groups, substituted alkyl groups, or halogens, wherein at least one of $R^1$, $R^2$, and $R^3$ is a fluorine atom, and wherein n is an integer from 1 to 5 representing the number of the nitro groups on the styrenic ring.

9. The multilayer optical compensation film of claim 8, wherein the nitrated styrenic fluoropolymer has an average degree of substitution ranging from about 0.2 to about 1 for the nitro group on the styrenic ring.

10. The multilayer optical compensation film of claim 8, wherein the nitrated styrenic fluoropolymer film has an average degree of substitution ranging from about 0.5 to about 0.9 for the nitro group on the styrenic ring.

11. The multilayer optical compensation film of claim 8, wherein the nitrated styrenic fluoropolymer is nitrated poly($\alpha,\beta,\beta$-trifluorostyrene) having an average degree of substitution ranging from about 0.2 to about 1 of the nitro group on the styrenic ring.

12. The multilayer optical compensation film of claim 4, wherein the polyimide film is made by a solution cast of a polymer solution comprising a polyimide.

13. The multilayer optical compensation film of claim 12, wherein the polyimide is a reaction product of components comprising an aromatic dianhydride and an aromatic diamine.

14. The multilayer optical compensation film of claim 13, wherein the aromatic dianhydride is selected from the group consisting of pyromelliticdianhydride (PMDA) (2), 3,3',4,4'-biphenyltetracarboxylic dianhydride (BPDA) (3), 4,4'-(hexafluoroisopropylidene)-diphthalic anhydride (6FDA) (4), 4,4'-(ethyne-1,2-diyl) diphthalic anhydride (EDDPA) (5), 4,4'-binaphthyl-1,1',8,8'-tetracarboxylic dianhydride (BNDA) (6), 1,4,5,8-naphthalenetetracarboxylic dianhydride (NDA) (7) represented by the following formulas (2) to (7) below:

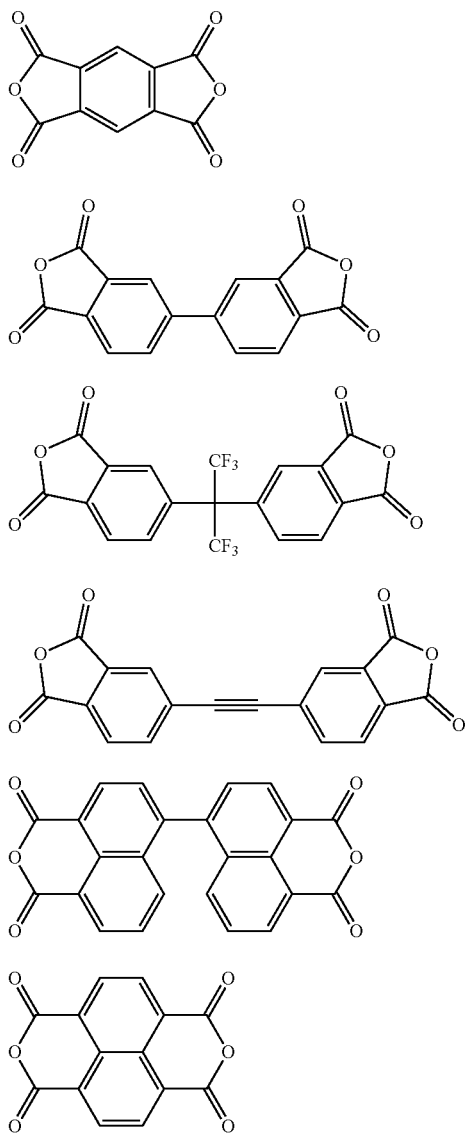

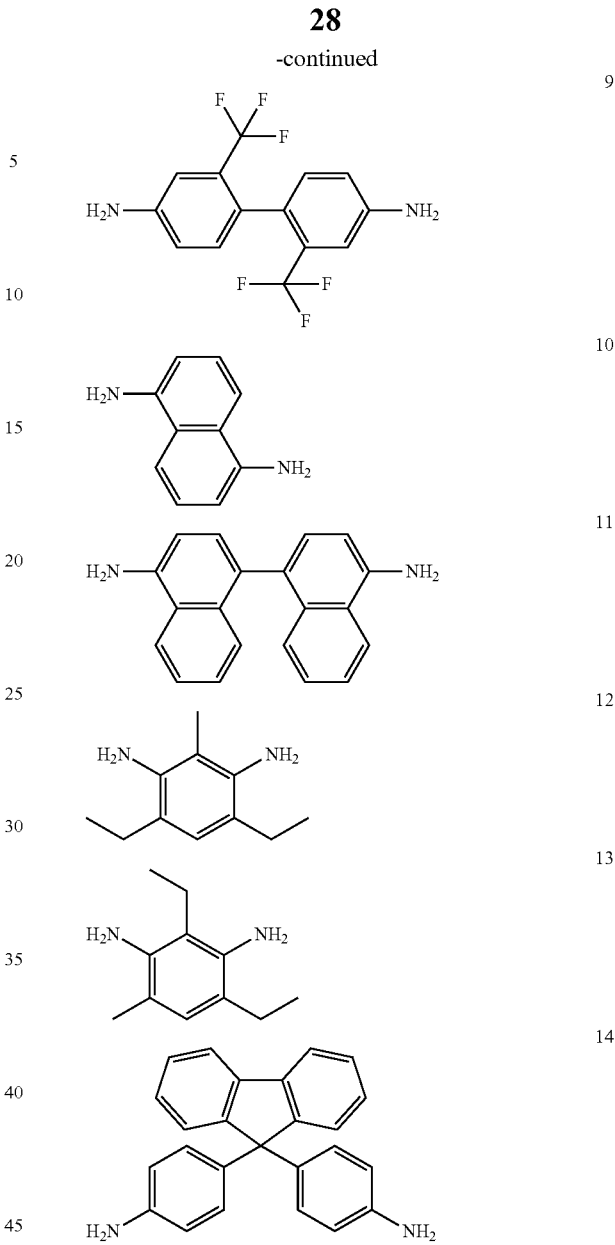

and combinations thereof.

15. The multilayer optical compensation film of claim 13, wherein the aromatic diamine is selected from the group consisting of 2,4-diaminomesitylene (DAM) (8), 2,2'-bis(trifluoromethyl)benzidine (PFMB) (9), 1,5-naphthalenediamine (DAN) (10), [1,1'-binaphthalene]-5,5'-diamine (DABN) (11), 3,5-diethyl-toluene-2,6-diamine (2,6-DETDA) (12), 3,5-diethyl-toluene-2,4-diamine (2,4-DETDA) (13), 4,4'-(9-fluorenylidene)-dianiline) (FRDA) (14) represented by the following formulas (8) to (14) below:

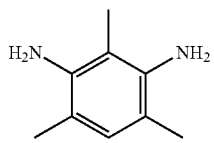

and combinations thereof.

16. The multilayer optical compensation film of claim 13, wherein the aromatic dianhydride is selected from the group consisting of 4,4'-(hexafluoroisopropylidene)diphthalic anhydride (6FDA), 4,4'-(ethyne-1,2-diyl) diphthalic anhydride (EDDPA), 4,4'-binaphthyl-1,1',8,8'-tetracarboxylic dianhydride (BNDA), and combinations thereof.

17. The multilayer optical compensation film of claim 13, wherein the aromatic diamine is selected from the group consisting of 2,4-diaminomesitylene (DAM), 3,5-diethyl-toluene-2,6-diamine (2,6-DETDA), 3,5-diethyl-toluene-2,4-diamine (2,4-DETDA), 4,4'-(9-fluorenylidene)dianiline) (FRDA), and combinations thereof.

18. The multilayer optical compensation film of claim 13, wherein the aromatic dianhydride is selected from the group consisting of 4,4'-(hexafluoroisopropylidene)diphthalic anhydride (6FDA), 4,4'-(ethyne-1,2-diyl) diphthalic anhydride (EDDPA), and 4,4'-binaphthyl-1,1',8,8'-tetracarboxylic dianhydride (BNDA), and the aromatic diamine is one or more selected from the group consisting of 2,4-diaminomesitylene (DAM), 3,5-diethyl-toluene-2,6-diamine (2,6-DETDA), 3,5-diethyl-toluene-2,4-diamine (2,4-DETDA), 4,4'-(9-fluorenylidene)dianiline) (FRDA), and combinations thereof.

19. The multilayer optical compensation film of claim 4, wherein the polyimide film has a negative out-of-plane birefringence of less than −0.04 throughout the wavelength range of from 400 nm to 800 nm.

20. The multilayer optical compensation film of claim 4, wherein the polyimide film has a negative out-of-plane birefringence of less than −0.05 throughout the wavelength range of from 400 nm to 800 nm.

21. The multilayer optical compensation film of claim 4, wherein the polyimide film is a coating film cast on the styrenic fluoropolymer film.

22. The multilayer optical compensation film of claim 4, wherein the styrenic fluoropolymer film has a thickness of from 3 to 30 μm.

23. The multilayer optical compensation film of claim 4, wherein the styrenic fluoropolymer film has a thickness of from 5 to 15 μm.

24. The multilayer optical compensation film of claim 4, wherein the polyimide film has a thickness of from 1 to 10 μm.

25. The multilayer optical compensation film of claim 4, wherein the polyimide film has a thickness of from 2 to 5 μm.

26. The multilayer optical compensation film of claim 4, wherein the styrenic fluoropolymer film has a positive out-of-plane birefringence greater than 0.015 throughout the wavelength range of from 400 nm to 800 nm.

27. The multilayer optical compensation film of claim 4, wherein the styrenic fluoropolymer film has a positive out-of-plane birefringence greater than 0.02 throughout the wavelength range of from 400 nm to 800 nm.

28. The multilayer optical compensation film of claim 4, wherein the styrenic fluoropolymer film has a positive out-of-plane birefringence greater than 0.03 throughout the wavelength range of from 400 nm to 800 nm.

29. The multilayer optical compensation film of claim 4, wherein the polyimide film has a negative out-of-plane birefringence of less than −0.03 throughout the wavelength range of from 400 nm to 800 nm.

30. The multilayer optical compensation film of claim 1, wherein said positive out-of-plane retardations satisfy the relations of $0.8<R(450)/R(550)<0.9$ and $1.01<R(650)/R(550)<1.2$.

31. The multilayer optical compensation film of claim 1, wherein the first layer is a nitrated styrenic fluoropolymer having an average degree of substitution ranging from about 0.6 to about 0.8 for the nitro group on the styrenic ring and the second layer is a polyimide film made by a solution cast of a polymer solution comprising a solvent and a polyimide, wherein the polyimide is the reaction product of the components comprising:
  (i). 4,4'-(hexafluoroisopropylidene)-diphthalic anhydride (6FDA) in an amount from about 15 to about 25 molar percent;
  (ii). 4,4'-(ethyne-1,2-diyl) diphthalic anhydride (EDDPA) in an amount from about 20 to about 30 molar percent, based on the total moles of (i) and (ii);
  (iii). 4,4'-binaphthyl-1,1',8,8'-tetracarboxylic dianhydride (BNDA) in an amount from about 45 to about 55 molar percent, based on the total moles of (i), (ii), and (iii); and
  (iv). 4,4'-(9-fluorenylidene)dianiline (FRDA).

32. The multilayer optical compensation film of claim 1, wherein the first layer is a nitrated styrenic fluoropolymer having an average degree of substitution (DS) ranging from about 0.6 to about 0.8 for the nitro group on the styrenic ring and the second layer is a polyimide film made by a solution cast of a polymer solution comprising a solvent and a polyimide, wherein the polyimide is the reaction product of the components, comprising:
  (i). 4,4'-(hexafluoroisopropylidene)-diphthalic anhydride (6FDA) in an amount from about 25 to about 35 molar percent;
  (ii). 4,4'-binaphthyl-1,1',8,8'-tetracarboxylic dianhydride (BNDA) in an amount from about 65 to about 75 molar percent, based on the total moles of (i) and (ii); and
  (iii). 4,4'-(9-fluorenylidene)dianiline (FRDA).

33. The multilayer optical compensation film of claim 1, wherein the first layer is a nitrated styrenic fluoropolymer having an average degree of substitution ranging from about 0.6 to about 0.8 for the nitro group on the styrenic ring and the second layer is a polyimide film made by a solution cast of a polymer solution comprising a solvent and a polyimide, wherein the polyimide is the reaction product of the components comprising
  (i). 4,4'-(hexafluoroisopropylidene)-diphthalic anhydride (6FDA) in an amount from about 40 to about 48 molar percent;
  (ii). 4,4'-binaphthyl-1,1',8,8'-tetracarboxylic dianhydride (BNDA) in an amount from about 52 to about 60 molar percent, based on the total moles of (i) and (ii); and
  (iii). 4,4'-(9-fluorenylidene)dianiline (FRDA).

34. The multilayer optical compensation film of claim 1, wherein said multilayer optical compensation film has positive out-of-plane retardations from about 100 nm to about 150 nm at the wavelength (λ) of 550 nm and a film thickness from about 5 micron (μm) to about 20 micron (μm).

35. The multilayer optical compensation film of claim 1 further comprising an A-plate having a refractive index profile of $n_x>n_y=n_z$, wherein $n_x$ and $n_y$ represent in-plane refractive indices, and $n_z$ the thickness refractive index.

36. The multilayer optical compensation film of claim 35, wherein the A-plate is a quarter wave plate (QWP).

37. The multilayer optical compensation film of claim 1 further comprising an B-plate having a refractive index profile of $n_x>n_y\neq n_z$, wherein $n_x$ and $n_y$ represent in-plane refractive indices, and $n_z$ the thickness refractive index.

38. The multilayer optical compensation film of claim 37, wherein the B-plate is a quarter wave plate (QWP).

39. A circular polarizer comprising the multilayer optical compensation film of claim 1.

40. A liquid crystal display comprising the multilayer optical compensation film of claim 1.

41. An OLED display comprising the multilayer optical compensation film of claim 1.

42. A multilayer optical compensation film comprising,
  (a) a styrenic fluoropolymer film and
  (b) a polyimide film,
wherein said multilayer optical compensation film has positive out-of-plane retardations that satisfy the relations of $0.98<R(450)/R(550)<1.02$ and $0.98<R(650)/R(550)<1.02$, wherein R(450), R(550), and R(650) are out-of-plane retardations at the light wavelengths of 450 nm, 550 nm, and 650 nm respectively.

43. The multilayer optical compensation film of claim 42, wherein said styrenic fluoropolymer film is a poly(α,β,β-trifluorostyrene) film.

44. The multilayer optical film of claim 42, wherein said styrenic fluoropolymer film is a nitrated poly($\alpha,\beta,\beta$-trifluorostyrene) film.

\* \* \* \* \*